United States Patent
Takken et al.

(10) Patent No.: US 11,792,954 B2
(45) Date of Patent: Oct. 17, 2023

(54) DEDICATED AIRFLOW CHANNELS FOR COOLING SERVER DRAWERS

(71) Applicant: International Business Machines Corporation, Armonk, NY (US)

(72) Inventors: Todd Edward Takken, Brewster, NY (US); Shurong Tian, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/651,954

(22) Filed: Feb. 22, 2022

(65) Prior Publication Data

US 2023/0269899 A1 Aug. 24, 2023

(51) Int. Cl.
*H05K 7/20* (2006.01)

(52) U.S. Cl.
CPC ..... *H05K 7/20136* (2013.01); *H05K 7/20836* (2013.01)

(58) Field of Classification Search
CPC .................................................. H05K 7/20145
See application file for complete search history.

(56) References Cited

U.S. PATENT DOCUMENTS

| | | | |
|---|---|---|---|
| 4,901,200 A | 2/1990 | Mazura | |
| 5,168,424 A | 12/1992 | Bolton | |
| 6,927,975 B2* | 8/2005 | Crippen | G06F 1/20 312/223.1 |
| 9,232,683 B2 | 1/2016 | Davis | |
| 10,531,598 B2 | 1/2020 | Coteus | |
| 10,888,019 B2* | 1/2021 | Mitsui | H05K 7/20145 |
| 2011/0176271 A1 | 7/2011 | Zhang | |
| 2014/0268552 A1* | 9/2014 | Provenzale | H05K 7/20727 361/679.46 |

FOREIGN PATENT DOCUMENTS

| | | |
|---|---|---|
| DE | 3734972 C2 | 7/1990 |
| DE | 102011005838 A1 | 9/2012 |

* cited by examiner

*Primary Examiner* — Mukundbhai G Patel
(74) *Attorney, Agent, or Firm* — Stosch Sabo

(57) ABSTRACT

A server drawer comprising a plurality of Printed Circuit Boards (PCBs) respectively containing heat-generating electronic devices. The server drawer further comprises a plurality of fans configured to convectively dissipate heat from the heat-generating electronic devices. The server drawer further comprises internal partitions isolating airflow between respective PCBs of the plurality of PCBs.

7 Claims, 7 Drawing Sheets

DEDICATED AIRFLOW CHANNELS FOR COOLING SERVER DRAWERS

BACKGROUND

The present disclosure relates to air cooling electronic devices, and, more specifically, to using fans to move air through dedicated airflow channels to cool server racks.

Data centers are a dedicated physical space for computer hardware components (e.g., storage devices, computational devices, networking devices, etc.). Data centers can use server racks to efficiently house computer hardware components. However, computer hardware components in the server racks can collectively generate a significant amount of heat. High temperatures can degrade performance of the computer hardware components and/or reduce the usable lifespan of various computer hardware components. Thus, data centers can employ various environmental controls to manage the ambient temperature experienced by the computer hardware components in the server racks.

SUMMARY

Aspects of the present disclosure are directed toward a server drawer comprising a plurality of Printed Circuit Boards (PCBs) respectively containing heat-generating electronic devices. The server drawer further comprises a plurality of fans configured to convectively dissipate heat from the heat-generating electronic devices. The server drawer further comprises internal partitions isolating airflow between respective PCBs of the plurality of PCBs.

Additional aspects of the present disclosure are directed toward a server drawer comprising a plurality of Printed Circuit Boards (PCBs) including an upstream PCB and a downstream PCB. The server drawer further comprises an upstream fan configured to convectively dissipate heat from the upstream PCB and a downstream fan configured to convectively dissipate heat from the downstream PCB. The server drawer further comprises internal partitions isolating airflow between the upstream PCB and the downstream PCB. The server drawer further comprises a cold-aisle tailstock seal configured to isolate a side-channel between the server drawer and a server rack from a cold aisle. The server drawer further comprises a sidewall vent configured to purge exhaust air from the upstream PCB into the side-channel.

Additional aspects of the present disclosure are directed toward a server drawer comprising a plurality of Printed Circuit Boards (PCBs) including an upstream PCB and a downstream PCB. The server drawer further comprises an upstream fan configured to convectively dissipate heat from the upstream PCB and a downstream fan configured to convectively dissipate heat from the downstream PCB. The server drawer further comprises internal partitions isolating airflow between the upstream PCB and the downstream PCB. The server drawer further comprises a hot-aisle tailstock seal configured to isolate a side-channel between the server drawer and a server rack from a hot aisle. The server drawer further comprises a sidewall vent configured to draw cool air through the side-channel and over the downstream PCB.

The present summary is not intended to illustrate each aspect of, every implementation of, and/or every embodiment of the present disclosure.

BRIEF DESCRIPTION OF THE DRAWINGS

The drawings included in the present application are incorporated into and form part of the specification. They illustrate embodiments of the present disclosure and, along with the description, serve to explain the principles of the disclosure. The drawings are only illustrative of certain embodiments and do not limit the disclosure.

Figure 1A:
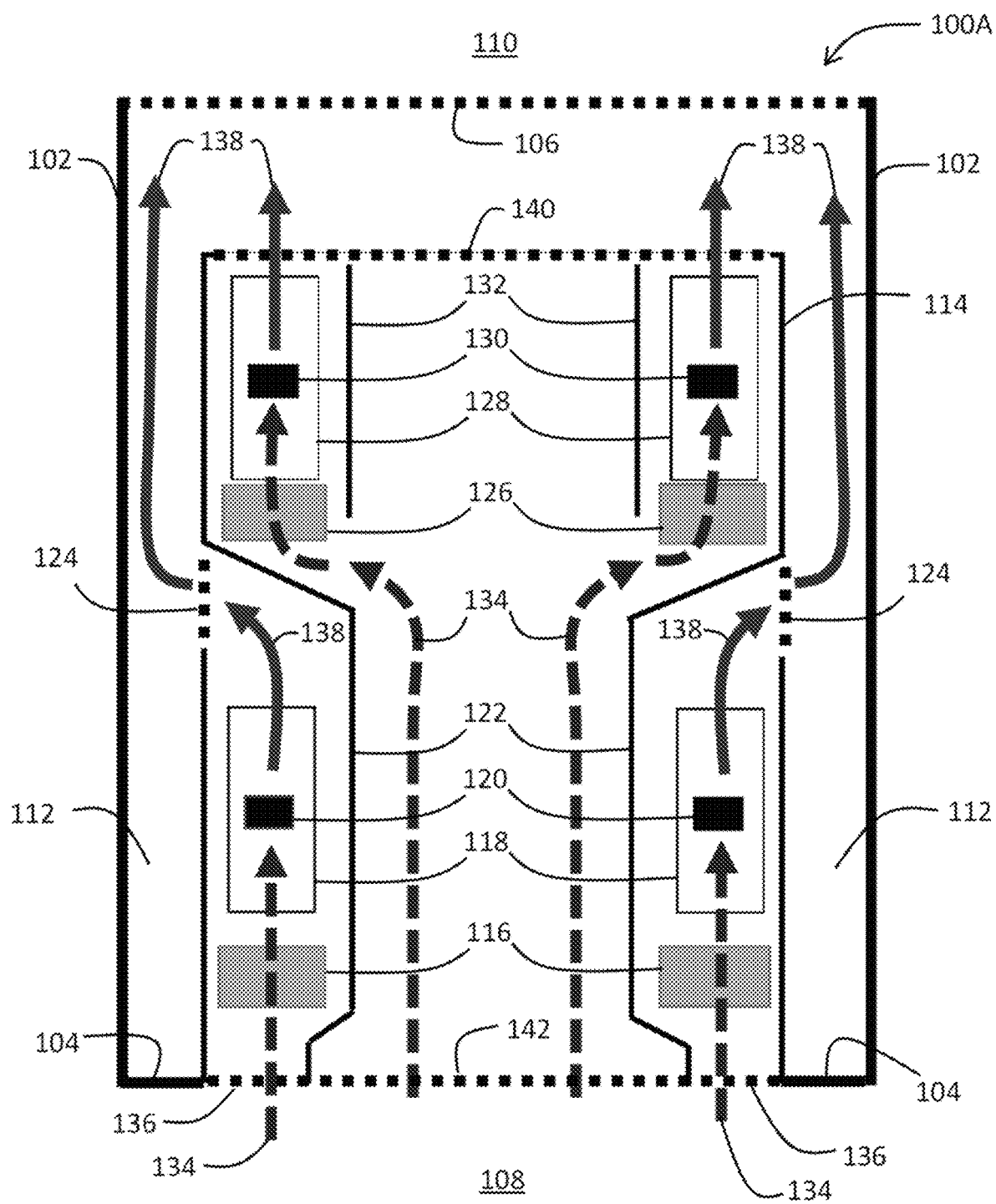
FIG. 1A illustrates a block diagram of dedicated airflow channels using a cold aisle tailstock seal with fans pushing air, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure are directed toward air cooling electronic devices, and, more specifically, to using fans to move air through dedicated airflow channels to cool server racks. While not limited to such applications, embodiments of the present disclosure may be better understood in light of the aforementioned context.

Aspects of the present disclosure are directed toward using fans to push and/or pull air through dedicated airflow channels to convectively cool components in a server drawer. Advantageously, by avoiding mixing cooling air between different components in a server drawer, aspects of the present disclosure can more efficiently cool each of the components in the server drawer. In particular, for components near a back-end (e.g., hot aisle end) of a server drawer, aspects of the present disclosure can convectively cool the back-end components using cooler air than traditional mechanisms (insofar as the cool air is provided to the back-end components using a dedicated airflow channel that does not include exhaust air from previously cooled front-end components).

Referring now to the figures, FIG. 1A illustrates a block diagram of dedicated airflow channels using a cold aisle tailstock seal 104 with fans pushing air, in accordance with some embodiments of the present disclosure. FIG. 1 includes a server rack 100A including sidewalls 102, cold aisle tailstock seal 104, and a rear door 106. As shown in FIG. 1A, the cold aisle tailstock seal 104 can isolate the cold aisle 108 from the hot aisle 110 in the side-channels 112 by preventing air from cold aisle 108 being drawn into side-channels 112. In FIG. 1A, the server rack 100A is configured with the cold aisle tailstock seal 104 adjacent to the cold aisle 108 and the rear door 106 adjacent to the hot aisle 110. The side-channels 112 of the server rack 100A can be formed by margins between a server drawer 114 and the sidewalls 102.

The server drawer 114 is retained within the server rack 100A. The server drawer 114 includes upstream fans 116 and Printed Circuit Boards (PCBs) such as upstream PCBs 118. Upstream PCBs 118 include upstream heat-generating electronic devices 120. The upstream fans 116, upstream PCBs 118, and upstream heat-generating electronic devices 120 can be separated from other components of the server drawer 114 by upstream internal partitions 122. In other words, upstream internal partitions 122 separate airflows between the upstream components and downstream components. The server drawer 114 further includes sidewall vents 124 configured to purge exhaust air 138 (illustrated by solid arrow lines) from the upstream PCBs 118 to side-channels 112 of the server rack 100A.

Server drawer 114 further includes downstream fans 126 and downstream PCBs 128. The downstream PCBs 128 likewise include downstream heat-generating electronic devices 130. The server drawer 114 further includes downstream internal partitions 132 for funneling airflow over the downstream PCBs 128.

The upstream fans 116 push cool air 134 (illustrated by dashed arrows) from the cool aisle 108 through the upstream intakes 136 of the server drawer 114 and over the PCBs 118 including the upstream heat-generating electronic devices 120. The cool air 134 convectively dissipates heat from the upstream heat-generating electronic devices 120 while passing over the upstream heat-generating devices 120. After the cool air 134 passes over the upstream heat-generating electronic devices 120, exhaust air 138 is channeled into side-channels 112 via sidewall vents 124 of the server drawer 114. The exhaust air 138 then flows out the rear door 106 of the server rack 100A and into the hot aisle 110.

Meanwhile, downstream fans 126 push cool air 134 from the downstream intake 142 of the server drawer 114 through the interior of the server drawer 114 (e.g., the central channel created by upstream internal partitions 122) to cool downstream heat-generating electronic devices 130 located on downstream PCBs 128. The exhaust air 138 travels through the back vent 140 of the server drawer 114, through the rear door 106 of the server rack 100, and into the hot aisle 110.

Collectively, FIG. 1A illustrates a server rack 100A exhibiting improved cooling performance insofar as the upstream internal partitions 122 isolate cooling airflows for the upstream PCBs 118 from cooling airflows to the downstream PCBs 128, thereby enabling the downstream PCBs 128 to be cooled with cool air 134 that is approximately the temperature of the cool aisle 108 (rather than a mixture of cool air 134 and exhaust air 138 from cooling the upstream PCBs 118).

Figure 1B:
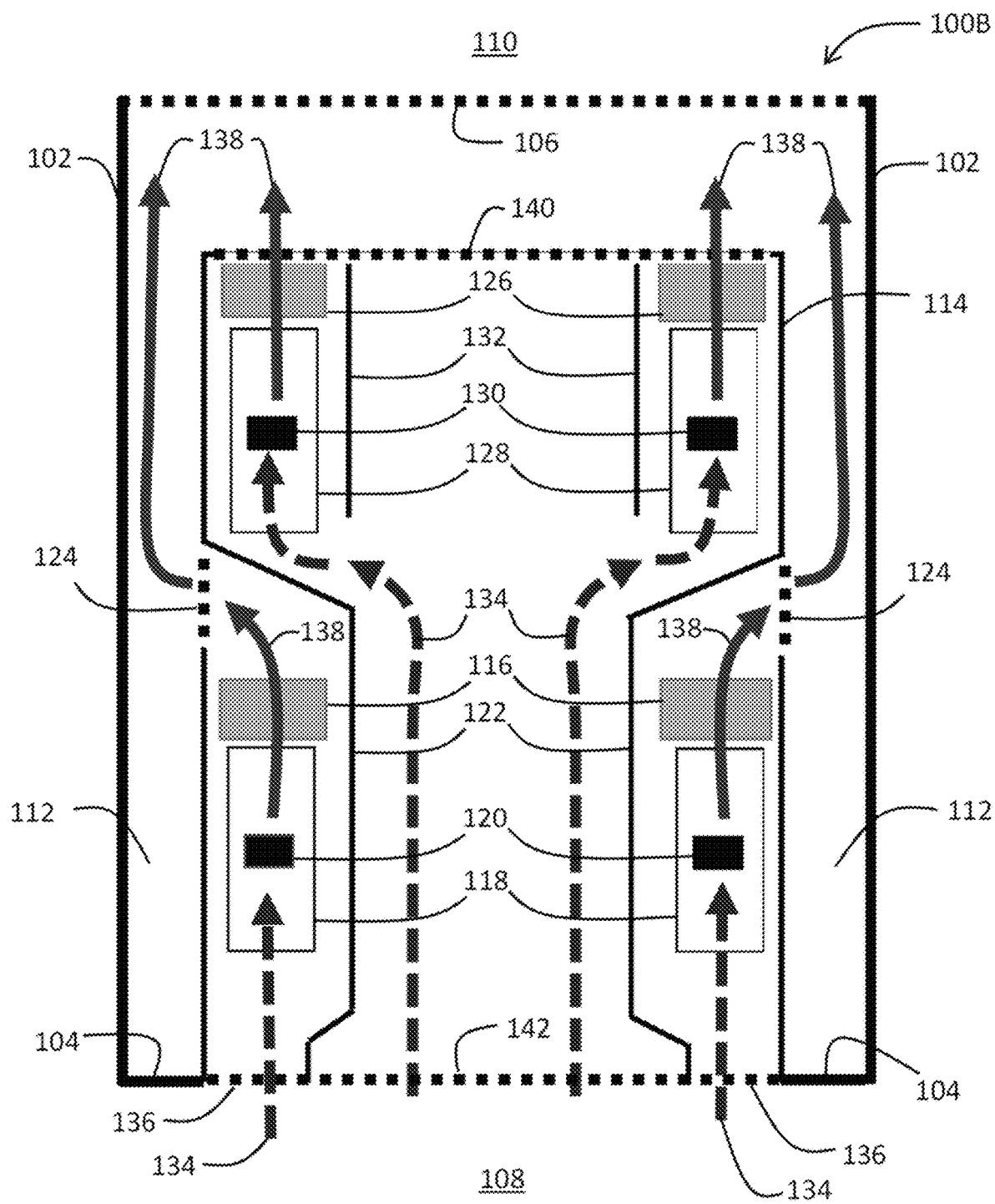
FIG. 1B illustrates a block diagram of dedicated airflow channels using a cold aisle tailstock seal with fans pulling air, in accordance with some embodiments of the present disclosure.

FIG. 1B illustrates a block diagram of dedicated airflow channels using a cold aisle tailstock seal 104 with fans pulling air, in accordance with some embodiments of the present disclosure. The server rack 100B of FIG. 1B illustrates components consistent with those discussed in FIG. 1A. Furthermore, the server rack 100B of FIG. 1B includes upstream fans 116 positioned after upstream PCBs 118 (whereas FIG. 1A illustrates upstream fans 116 positioned before upstream PCBs 118). Likewise, the server rack 100B includes downstream fans 126 positioned after the downstream PCBs 128. Accordingly, server rack 100B is configured to pull cool air 134 over upstream heat-generating electronic devices 120 and downstream heat-generating electronic devices 130 (rather than pushing cool air 134 over heat-generating electronic devices 120, 130 as discussed with respect to FIG. 1A).

Figure 1C:
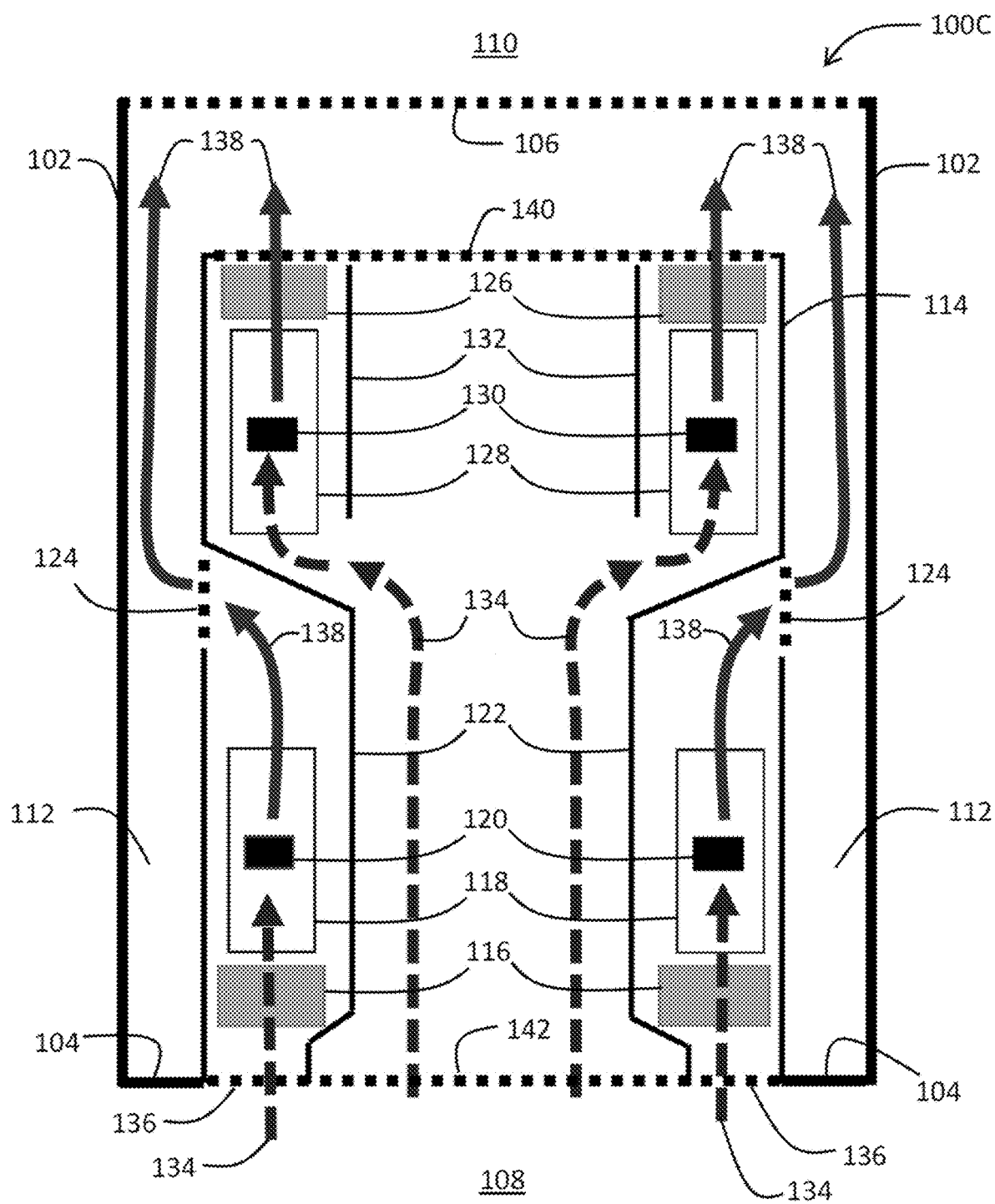
FIG. 1C illustrates a block diagram of dedicated airflow channels using a cold aisle tailstock seal with a subset of fans pushing air and another subset of fans pulling air, in accordance with some embodiments of the present disclosure.

FIG. 1C illustrates a block diagram of dedicated airflow channels using a cold aisle tailstock seal 104 with a subset of fans pushing air and another subset of fans pulling air, in accordance with some embodiments of the present disclosure. The server rack 100C of FIG. 1C illustrates components consistent with those discussed in FIG. 1A. Furthermore, the server rack 100C includes upstream fans 116 positioned before upstream PCBs 118 and downstream fans 126 positioned after the downstream PCBs 128. Accordingly, server rack 100C is configured to push cool air 134 over upstream heat-generating electronic devices 120 and pull cool air 134 over downstream heat-generating electronic devices 130.

Regarding FIGS. 1A, 1B, and 1C, the various configurations of upstream fans 116 and downstream fans 126 relative to upstream PCBs 118 and downstream PCBs 128 can be configured to improve heat-dissipation, energy efficiency, manufacturability, maintainability, and/or other considerations. Regarding heat-dissipation, the location of upstream fans 116 and downstream fans 126 can be configured for beneficial velocity, turbulence (e.g., laminar or non-laminar gaseous airflow), volumetric flow-rate, and/or other characteristics related to convective heat-dissipation. As another example, the heat generated by upstream fans 116 and downstream fans 126 can be considered in order to configure the upstream fans 116 and/or downstream fans 126 to remove more of the heat generated by upstream fans 116 and/or downstream fans 126.

Regarding energy efficiency, the location of upstream fans 116 and downstream fans 126 can be configured for beneficial energy usage. For example, when placed in one position, fans 116, 126 may achieve similar heat-dissipation with different fan speeds (and therefore, different energy usage) versus a different position.

Regarding manufacturability, the location of upstream fans 116 and downstream fans 126 can be determined by the available space in a server drawer 114 and/or the configuration of server rack 100A, 100B, and/or 100C. Regarding maintainability, the location of upstream fans 116 and downstream fans 126 can impact the ease of replacement. For example, upstream fans 116 may be more readily replaceable when configured to push air while downstream fans 126 can be more readily replaceable when configured to pull air (as shown in FIG. 1C) insofar as this configuration places the fans nearer to the aisles. In contrast, when fans 116, 126 are designed to be more reliable than other components of server drawer 114 (e.g., upstream PCBs 118 and/or downstream PCBs 128), the fans 116, 126 can be positioned in places relatively more challenging for replacement in order to make other, less reliable components relatively easier to replace.

Figure 2A:
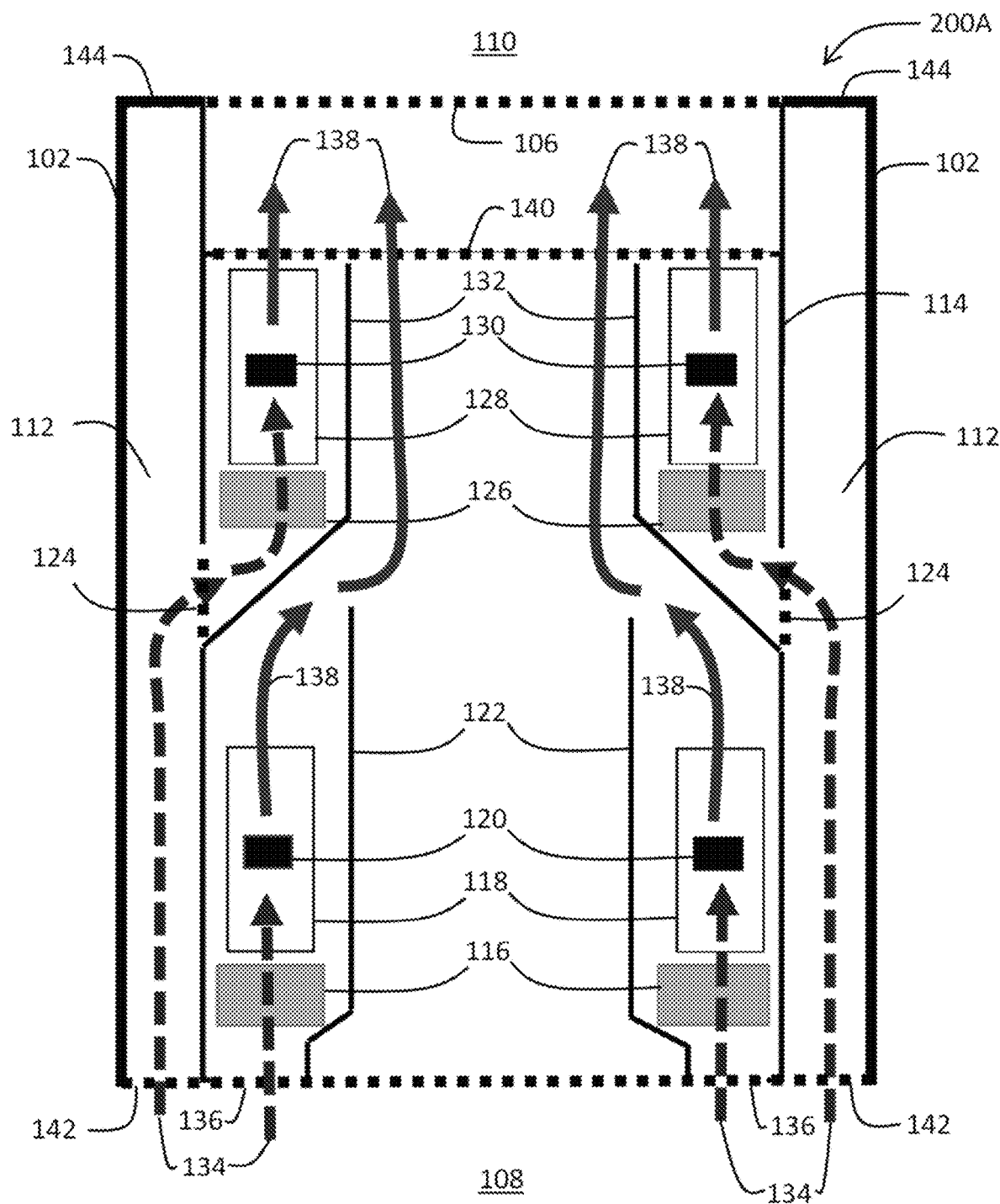
FIG. 2A illustrates a block diagram of dedicated airflow channels using a hot aisle tailstock seal with fans pushing air, in accordance with some embodiments of the present disclosure.

FIG. 2A illustrates a block diagram of dedicated airflow channels using a hot aisle tailstock seal 144 with fans pushing air, in accordance with some embodiments of the present disclosure. The server rack 200A of FIG. 2A illustrates components consistent with those discussed in FIGS.

1A-1C. However, while FIGS. 1A-1C included cold aisle tailstock seals 104, the server rack 200A includes no such cold aisle tailstock seal 104. Instead, server rack 200A includes a hot aisle tailstock seal 144 configured to isolate the cold aisle 108 from the hot aisle 110 in the side channels 112 by preventing air from hot aisle 110 into the side channels 112. As shown in FIG. 2A, the hot aisle tailstock seal 144 is adjacent to the hot aisle 110. Further differentiating server rack 200A from the server racks 100A, 100B, and 100C is the function of sidewall vents 124. In server rack 200A, sidewall vents 124 are used to draw cool air 134 into the side channels 112 and into the downstream fans 126, thereby causing the side channels 112 to function as a dedicated airflow channel for the downstream components. As a result, the upstream fans 116 purge exhaust air 138 into a central aisle of the server drawer 114 (e.g., the central aisle formed by upstream internal partitions 132), out the back vent 140 of the server drawer 114, and then out the rear door 106 of the server rack 200A and into the hot aisle 110. As shown in FIG. 2A, the upstream fans 116 and downstream fans 126 are both configured to push cool air 134 over the upstream PCBs 118 and downstream PCBs 128. In other words, upstream fans 116 are positioned between the cold aisle 108 and the upstream PCBs 118 while the downstream fans 126 are positioned after the upstream PCBs 118 and before the downstream PCBs 128.

Figure 2B:
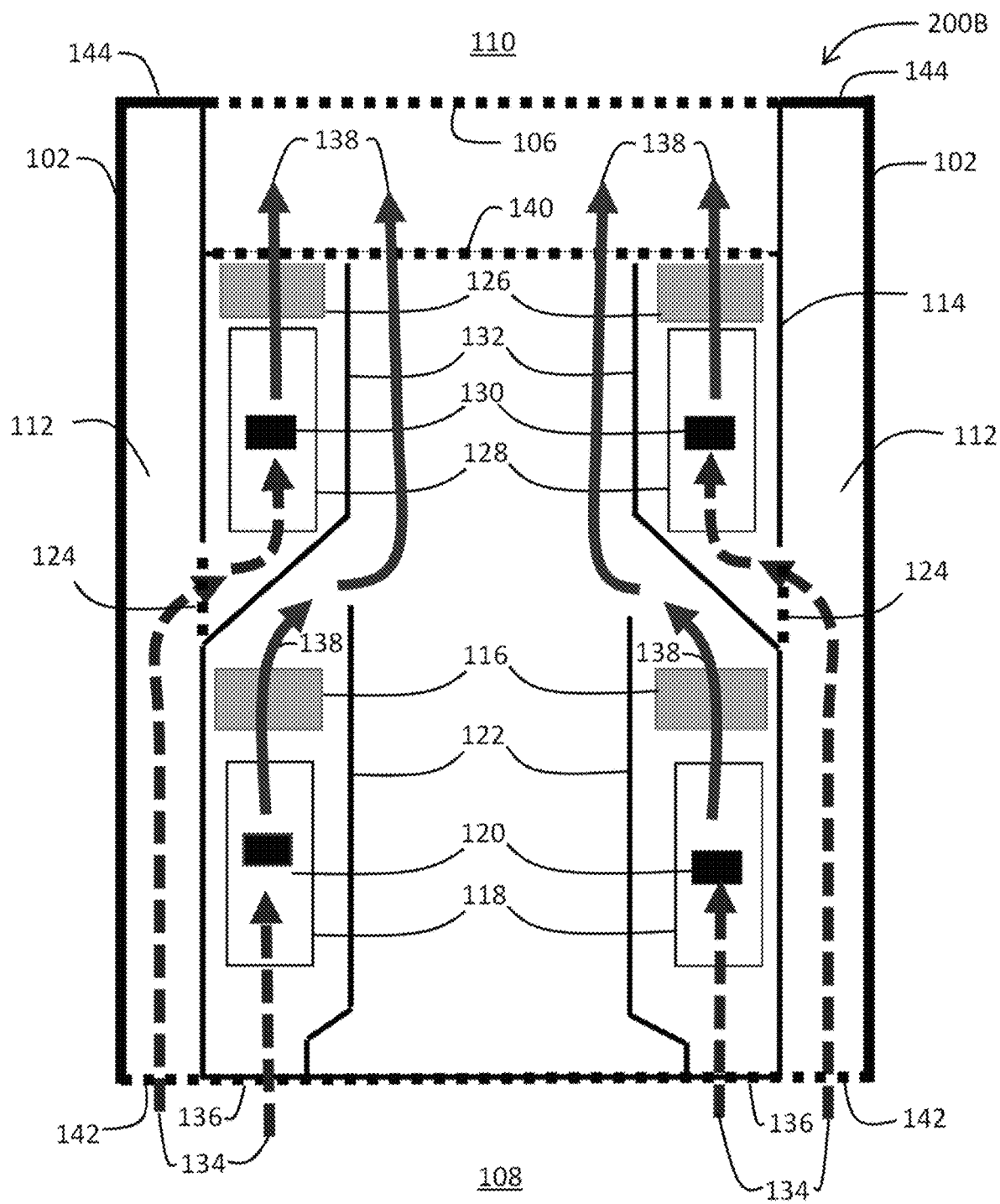
FIG. 2B illustrates a block diagram of dedicated airflow channels using a hot aisle tailstock seal with fans pulling air, in accordance with some embodiments of the present disclosure.

FIG. 2B illustrates a block diagram of dedicated airflow channels using a hot aisle tailstock seal 144 with fans pulling air, in accordance with some embodiments of the present disclosure. The server rack 200B of FIG. 2B illustrates components consistent with those discussed in FIG. 2A. However, in FIG. 2B, upstream fans 116 are configured to pull air over upstream PCBs 118 and downstream fans 126 are configured to pull air over downstream PCBs 128. In other words, upstream fans 116 are positioned between the upstream PCBs 118 and the downstream PCBs 128 while the downstream fans 126 are positioned between the downstream PCBs 128 and the hot aisle 110.

Figure 2C:
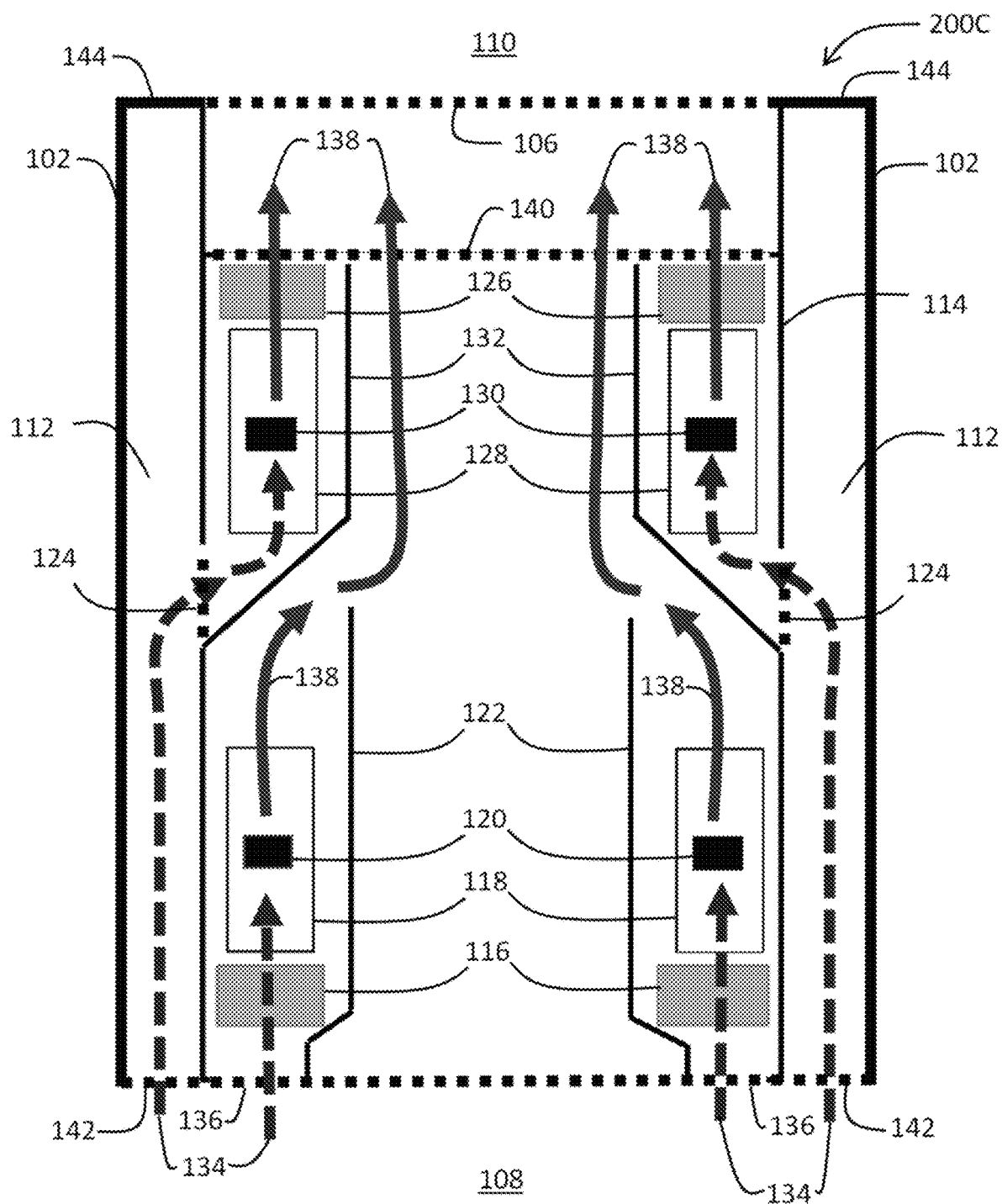
FIG. 2C illustrates a block diagram of dedicated airflow channels using a hot aisle tailstock seal with a subset of fans pushing air and another subset of fans pulling air, in accordance with some embodiments of the present disclosure.

FIG. 2C illustrates a block diagram of dedicated airflow channels using a hot aisle tailstock seal 144 with a subset of fans pushing air and another subset of fans pulling air, in accordance with some embodiments of the present disclosure. The server rack 200C of FIG. 2C illustrates components consistent with those discussed in FIG. 2A. However, in FIG. 2C, upstream fans 116 are configured to push air over upstream PCBs 118 and downstream fans 126 are configured to pull air over downstream PCBs 128. In other words, upstream fans 116 are positioned between the cold aisle 108 and the upstream PCBs 118 while the downstream fans 126 are positioned between the downstream PCBs 128 and the hot aisle 110.

As previously discussed with respect to FIGS. 1A-1C, the various configurations of upstream fans 116 and downstream fans 126 relative to upstream PCBs 118 and downstream PCBs 128 as shown in FIGS. 2A-2C (e.g., whether fans are pulling or pushing air for convective heat dissipation) can be configured to improve heat-dissipation, energy efficiency, manufacturability, maintainability, and/or other considerations. Furthermore, the use of a cold aisle tailstock seal 104 (as shown in FIGS. 1A-1C) versus a hot aisle tailstock seal 144 (as shown in FIGS. 2A-2C) can be used to improve heat-dissipation, energy efficiency, manufacturability, maintainability, and/or other considerations based on the configuration of the server rack 200, the configuration of the server drawer 114, and/or the types of components in the server drawer 114.

Figure 3:
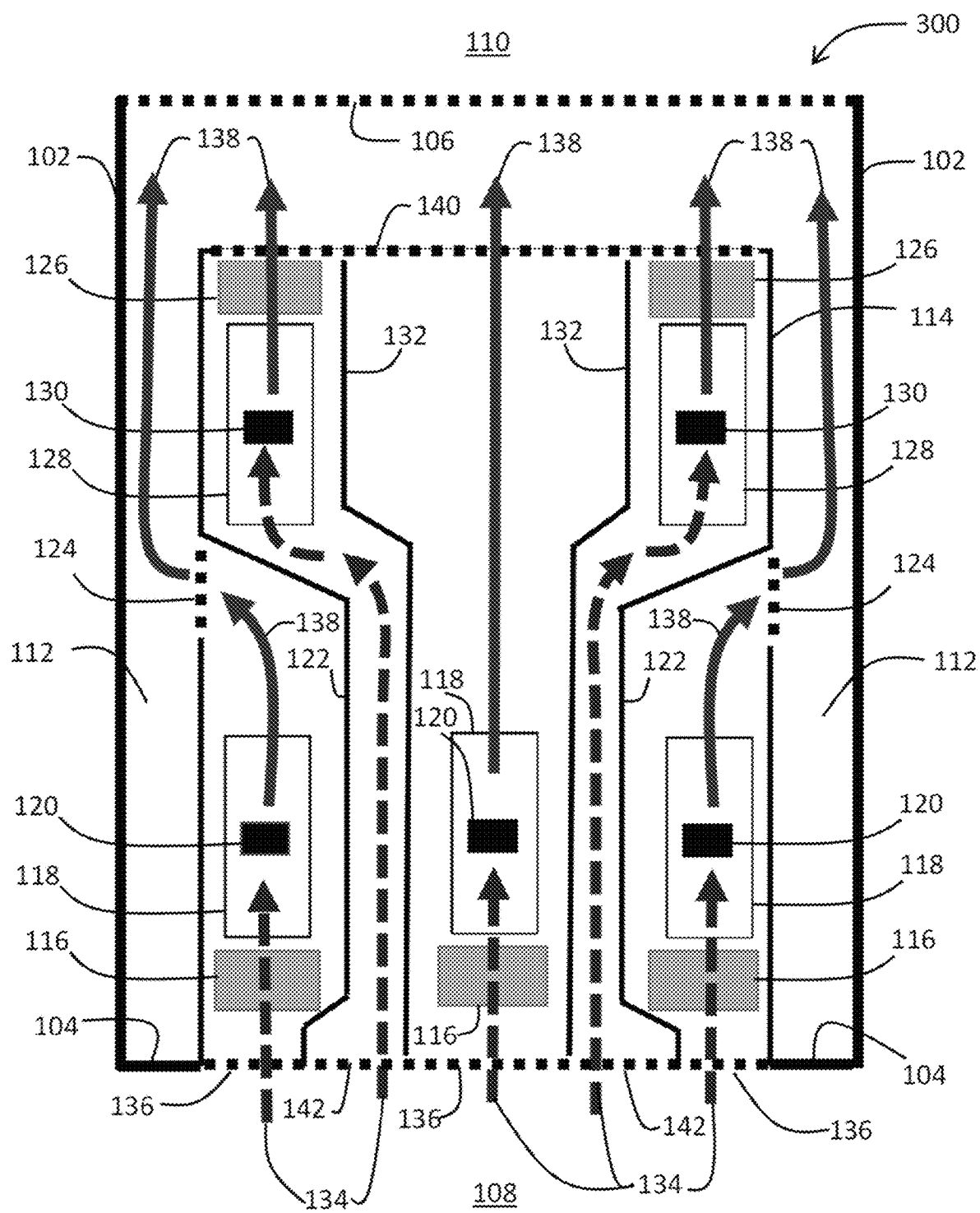
FIG. 3 illustrates a block diagram of dedicated airflow channels using a cold aisle tailstock seal and additional configurations of components, in accordance with some embodiments of the present disclosure.

FIG. 3 illustrates a block diagram of dedicated airflow channels using a cold aisle tailstock seal 104 and additional configurations of components, in accordance with some embodiments of the present disclosure. The server rack 300 of FIG. 3 illustrates components consistent with those discussed in FIGS. 1A-1C and FIGS. 2A-2C. However, in contrast to FIGS. 1A-1C and FIGS. 2A-2C, the server rack 300 of FIG. 3 illustrates three upstream PCBs 118, three upstream fans 116, two downstream PCBs 128, and two downstream fans 126. In other words, the portion of server rack 300 adjacent to the cold aisle 108 includes three upstream intakes 136 and two downstream intakes 142. Furthermore, upstream internal partitions 122 and downstream internal partitions 132 both extend the length of the server drawer 114 in order to fully isolate airflow between the upstream PCBs 118 and downstream PCBs 128.

As shown in FIG. 3, the outermost upstream PCBs 118 have cool air 134 pushed over them by upstream fans 116. The cool air 134 travels over upstream heat-generating electronic devices 120 and becomes exhaust air 138. Exhaust air 138 is purged out sidewall vents 124 into the side channels 112 of the server rack 300 and then travels into the hot aisle 110. Meanwhile, the center upstream fan 116 pushes cool air 134 over the upstream heat-generating electronic device 120 of the center upstream PCB 118. Exhaust air 138 is then purged through the central channel created by the downstream internal partitions 132. The exhaust air 138 travels out the back vent 140, through the rear door 106, and into the hot aisle 110.

Regarding the downstream PCBs 128, downstream intakes 142 draw the cool air 134 through the channel formed by upstream internal partitions 122 and downstream internal partitions 132. Downstream fans 126 pull cool air 134 across downstream heat-generating electronic devices 130 and purge exhaust air 138 out the back vent 140 and rear door 106 into the hot aisle 110.

As previously discussed with respect to FIGS. 1A-1C and FIGS. 2A-2C, various configurations of upstream fans 116 and downstream fans 126 relative to upstream PCBs 118 and downstream PCBs 128 can be implemented in order to improve heat-dissipation, energy efficiency, manufacturability, maintainability, and/or other considerations. Furthermore, more or fewer fans can be used than those shown in the figures, and the fans can be arranged in different positions and/or orientations than the positions and orientations shown in the figures.

FIG. 3 is shown to represent applications of the present disclosure in embodiments including more than two upstream PCBs 118 and/or more than two downstream PCBs 128. As will be appreciated by one skilled in the art, numerous configurations of upstream internal partitions 122, downstream internal partitions 132, upstream fans 116, downstream fans 126, sidewall vents 124, cold aisle tailstock seals 104, and/or hot aisle tailstock seals 144 can be made to accommodate various configurations of upstream PCBs 118, downstream PCBs 128, and/or server drawers 114.

As discussed herein, server racks (e.g., server rack 100A, 100B, 100C, 200A, 200B, 200C, and/or 300) can refer to any server rack now known or later developed. Server racks can refer to any frame, enclosure, or cabinet useful for retaining various data processing equipment, electrical equipment, electronic equipment, and/or other equipment related to powering, connecting, interconnecting, utilizing, and/or storing computer hardware. Likewise, server drawer 114 can refer to receptacle for a server or other data processing equipment within a server rack. In some embodiments, server drawer 114 is permanently or semi-permanently incorporated into a server rack (e.g., when server drawers are provided by a same manufacturer as a server rack), whereas in other instances different server drawers 114 are readily interchangeable between different server racks.

The inclusion of upstream PCBs 118 and downstream PCBs 128 in server drawer 114 is purely exemplary. In other embodiments, server drawer 114 houses networking hardware (e.g., modems, hubs, repeaters, etc.), storage hardware (e.g., disk storage, Flash storage, volatile and/or non-volatile storage, etc.), computing hardware (e.g., processors, graphics processing units (GPUs), accelerators, etc.), and/or other computer-related hardware. Furthermore, the upstream heat-generating devices 120 and downstream heat-generating devices 130 need not be discrete devices relative to the PCBs 118, 128. Rather, heat-generating devices 120, 130 can collectively refer to circuitry in PCBs 118, 128 (or other computer-related hardware) that generate heat. Furthermore, although several heat-generating electronic devices 120, 130 are shown in the figures, in other embodiments, server drawer 114 contains as few as one or as many as hundreds or thousands of discrete heat-generating electronic devices 120, 130.

Upstream fans 116 and downstream fans 126 can be axial fans and/or centrifugal fans. Although not explicitly shown, upstream fans 116 and downstream fans 126 can be variable speed fans with sensors, circuitry, and logic configured to increase or decrease fan speed according to a protocol, such as by time of day, ambient temperature, power draw of the associated server drawer 114, and the like.

Upstream internal partitions 122 and downstream internal partitions 132 can fully or partially isolate airflow between PCBs (e.g., between upstream PCBs 118 and downstream PCBs 128). Upstream internal partitions 122 and downstream internal partitions 132 can be formed from metal (e.g., steel, aluminum, alloy), plastic (e.g., thermoplastic, thermoset, etc.), elastomer (e.g., rubber, thermoplastic elastomer, etc.), or a combination of the aforementioned materials. In some embodiments, internal partitions 122, 132 can be a relatively more rigid material (e.g., metal, plastic, etc.) that is over molded with a relatively softer material (e.g., elastomer) such that the more rigid material provides structural support while the softer material creates an approximately airtight seal for each of the dedicated airflow channels. In some embodiments, upstream internal partitions 122 and downstream internal partitions 132 are manufactured contemporaneously with the server drawer 114 (e.g., unified constructions), while in other embodiments, upstream internal partitions 122 and/or downstream internal partitions 132 are retrofitted to an existing server drawer 114 (e.g., ad hoc construction).

Upstream intakes 136, downstream intakes 142, sidewall vents 124, back vent 140, and rear door 106 are all configured to be semi-permeable (as indicated by dashed lines) in order to draw cool air 134 into, or purge exhaust air 138 from, the server drawer 114. As used herein, semi-permeable can mean slits, perforations, screens, and/or other openings useful for enabling airflow.

As will be appreciated by one skilled in the art, the dimensions shown in the drawings, whether absolute or relative, are not necessarily to scale. Furthermore, the configurations shown in the drawings and described in the specification are intended to be representative of some embodiments and are simplified for ease of discussion. In other embodiments, aspects of the present disclosure can be employed in server drawers 114 having more complicated numbers and arrangements of data processing elements, fans, and internal partitions forming dedicated airflow channels.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments can be practiced. These embodiments were described in sufficient detail to enable those skilled in the art to practice the embodiments, but other embodiments can be used and logical, mechanical, electrical, and other changes can be made without departing from the scope of the various embodiments. In the previous description, numerous specific details were set forth to provide a thorough understanding the various embodiments. But the various embodiments can be practiced without these specific details. In other instances, well-known circuits, structures, and techniques have not been shown in detail in order not to obscure embodiments.

Different instances of the word "embodiment" as used within this specification do not necessarily refer to the same embodiment, but they can. Any data and data structures illustrated or described herein are examples only, and in other embodiments, different amounts of data, types of data, fields, numbers and types of fields, field names, numbers and types of rows, records, entries, or organizations of data can be used. In addition, any data can be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

Any advantages discussed in the present disclosure are example advantages, and embodiments of the present disclosure can exist that realize all, some, or none of any of the discussed advantages while remaining within the spirit and scope of the present disclosure.

The following is a non-limiting list of examples of aspects of the present disclosure. Example 1 is a server drawer comprising: a plurality of Printed Circuit Boards (PCBs) respectively containing heat-generating electronic devices; a plurality of fans configured to convectively dissipate heat from the heat-generating electronic devices; and internal partitions isolating airflow between respective PCBs of the plurality of PCBs.

Example 2 includes the features of Example 1, wherein the plurality of fans are between a cold aisle and the plurality of PCBs, wherein the plurality of fans are configured to push cool air over the plurality of PCBs to dissipate heat from the heat-generating electronic devices.

Example 3 includes the features of Example 1, wherein the plurality of PCB s are between a cold aisle and the plurality of fans, wherein the plurality of fans are configured to pull cool air over the plurality of PCBs to dissipate heat from the heat-generating electronic devices.

Example 4 includes the features of Example 1, wherein a first subset of the plurality of fans are between a cold aisle and a first subset of the plurality of PCBs, wherein the first subset of the plurality of fans are configured to push cool air over the first subset of the plurality of PCBs to dissipate heat from the heat-generating electronic devices of the first subset of the plurality of PCBs, and wherein a second subset of the plurality of fans are between a hot aisle and a second subset of the plurality of PCBs, wherein the second subset of the plurality of fans are configured to pull cool air over the second subset of the plurality of PCBs to dissipate heat from the heat-generating electronic devices of the second subset of the plurality of PCBs.

Example 5 includes the feature of Example 1, further comprising a cold-aisle tailstock seal configured to isolate a side-channel between the server drawer and a server rack from a cold aisle.

Example 6 includes the features of Example 5, further comprising a sidewall vent configured to purge exhaust air from at least one PCB of the plurality of PCBs into the side-channel.

Example 7 includes the features of Example 6, wherein the at least one PCB is an upstream PCB of the plurality of PCBs.

Example 8 includes the features of Example 1, further comprising a hot-aisle tailstock seal configured to isolate a side-channel between the server drawer and a server rack from a hot aisle.

Example 9 includes the features of Example 8, further comprising a sidewall vent configured to draw cool air through the side-channel and over at least one PCB of the plurality of PCBs.

Example 10 includes the features of Example 9, wherein the at least one PCB is a downstream PCB of the plurality of PCBs.

Example 11 is a server drawer comprising: a plurality of Printed Circuit Boards (PCBs) including an upstream PCB and a downstream PCB; an upstream fan configured to convectively dissipate heat from the upstream PCB and a downstream fan configured to convectively dissipate heat from the downstream PCB; internal partitions isolating airflow between the upstream PCB and the downstream PCB; a cold-aisle tailstock seal configured to isolate a side-channel between the server drawer and a server rack from a cold aisle; and a sidewall vent configured to purge exhaust air from the upstream PCB into the side-channel.

Example 12 includes the features of Example 11, wherein the upstream fan is between the cold aisle and the upstream PCB, wherein the upstream fan is configured to push cool air over the upstream PCB to dissipate heat from the upstream PCB.

Example 13 includes the features of Example 11, wherein the upstream PCB is between the cold aisle and the upstream fan, wherein the upstream fan is configured to pull cool air over the upstream PCB to dissipate heat from the upstream PCB.

Example 14 includes the features of Example 11, wherein the upstream fan is between the cold aisle and the upstream PCB, wherein the upstream fan is configured to push cool air over the upstream PCB to dissipate heat from the upstream PCB, and wherein the downstream fan is between a hot aisle and the downstream PCB, wherein the downstream fan is configured to pull cool air over the downstream PCB to dissipate heat from the downstream PCB.

Example 15 includes the features of Example 11, wherein the upstream PCB is between the cold aisle and the upstream fan, wherein the upstream fan is configured to pull cool air over the upstream PCB to dissipate heat from the upstream PCB, and wherein the downstream PCB is between a hot aisle and the downstream fan, wherein the downstream fan is configured to push cool air over the downstream PCB to dissipate heat from the downstream PCB.

Example 16 is a server drawer comprising: a plurality of Printed Circuit Boards (PCBs) including an upstream PCB and a downstream PCB; an upstream fan configured to convectively dissipate heat from the upstream PCB and a downstream fan configured to convectively dissipate heat from the downstream PCB; internal partitions isolating airflow between the upstream PCB and the downstream PCB; a hot-aisle tailstock seal configured to isolate a side-channel between the server drawer and a server rack from a hot aisle; and a sidewall vent configured to draw cool air through the side-channel and over the downstream PCB.

Example 17 includes the features of Example 16, wherein the upstream fan is between a cold aisle and the upstream PCB, wherein the upstream fan is configured to push cool air over the upstream PCB to dissipate heat from the upstream PCB.

Example 18 includes the features of Example 16, wherein the upstream PCB is between a cold aisle and the upstream fan, wherein the upstream fan is configured to pull cool air over the upstream PCB to dissipate heat from the upstream PCB.

Example 19 includes the features of Example 16, wherein the upstream fan is between a cold aisle and the upstream PCB, wherein the upstream fan is configured to push cool air over the upstream PCB to dissipate heat from the upstream PCB, and wherein the downstream fan is between the hot aisle and the downstream PCB, wherein the downstream fan is configured to pull cool air over the downstream PCB to dissipate heat from the downstream PCB.

Example 20 includes the features of Example 16, wherein the upstream PCB is between a cold aisle and the upstream fan, wherein the upstream fan is configured to pull cool air over the upstream PCB to dissipate heat from the upstream PCB, and wherein the downstream PCB is between the hot aisle and the downstream fan, wherein the downstream fan is configured to push cool air over the downstream PCB to dissipate heat from the downstream PCB.

What is claimed is:

1. A server drawer comprising:
   a plurality of Printed Circuit Boards (PCBs) respectively containing heat-generating electronic devices, wherein the plurality of PCBs comprises upstream PCBs, downstream PCBs, and a central PCB, wherein the central PCB is disposed between the upstream PCBs, wherein the upstream PCBs are adjacent to a cold aisle, and wherein the downstream PCBs are adjacent to a hot aisle;
a plurality of fans configured to convectively dissipate heat from the heat-generating electronic devices, wherein the plurality of fans includes upstream fans adjacent to the cold aisle and configured to push cool air over the upstream PCBs and the central PCB, and downstream fans adjacent to the hot aisle and configured to pull cool air over the downstream PCBs; and
internal partitions isolating airflow between respective PCBs of the plurality of PCBs, wherein the internal partitions include channels isolating airflow from the cold aisle to the downstream PCBs, sidewall vents purging exhaust air from the upstream PCBs into side-channels disposed between the server drawer and a server rack, and cold-aisle tailstock seals configured to prevent air from the cold aisle entering the side-channels.

2. The server drawer of claim 1, wherein the plurality of fans are axial fans.

3. The server drawer of claim 1, wherein the plurality of fans are centrifugal fans.

4. The server drawer of claim 1, wherein the plurality of fans are variable speed fans.

5. The server drawer of claim 4, wherein the plurality of fans are configured to vary speed as a function of time-of-day.

6. The server drawer of claim 4, wherein the plurality of fans are configured to vary speed as a function of ambient temperature.

7. The server drawer of claim 4, wherein the plurality of fans are configured to vary speed as a function of a power draw of the server drawer.

* * * * *